United States Patent
Bar

(10) Patent No.: US 11,686,689 B2
(45) Date of Patent: *Jun. 27, 2023

(54) AUTOMATIC OPTIMIZATION OF AN EXAMINATION RECIPE

(71) Applicant: Applied Materials Israel Ltd., Rehovot (IL)

(72) Inventor: Amir Bar, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,063

(22) Filed: Mar. 17, 2022

(65) Prior Publication Data

US 2022/0205928 A1 Jun. 30, 2022

Related U.S. Application Data

(63) Continuation of application No. 16/995,728, filed on Aug. 17, 2020, now Pat. No. 11,307,150.

(51) Int. Cl.
*G01N 21/95* (2006.01)
*G06T 7/00* (2017.01)

(52) U.S. Cl.
CPC ....... *G01N 21/9501* (2013.01); *G06T 7/0004* (2013.01); *G06T 2207/30148* (2013.01)

(58) Field of Classification Search
CPC .............. G01N 21/9501; G06T 7/0004; G06T 2207/30148
See application file for complete search history.

(56) References Cited

U.S. PATENT DOCUMENTS

| 9,880,550 | B2 | 1/2018 | Wachs |
| 11,022,566 | B1 | 6/2021 | Alumot et al. |
| 2015/0362908 | A1 | 12/2015 | Lee et al. |
| 2019/0370955 | A1* | 12/2019 | Zhang ................... G06N 20/00 |

OTHER PUBLICATIONS

Kwak, Jin Tae, et al., BMC Cancer 2011, "Multimodal microscopy for automated histologic analysis of prostate cancer", http://www.biomedcentral.com/1471-2407/11/62, Feb. 9, 2011, 16 pages.
USPTO, Office Action for U.S. Appl. No. 16/995,728, dated Aug. 24, 2021.
USPTO, Notice of Allowance for U.S. Appl. No. 16/995,728, dated Dec. 16, 2021.

* cited by examiner

*Primary Examiner* — Jamil Ahmed
(74) *Attorney, Agent, or Firm* — Lowenstein Sandler LLP

(57) ABSTRACT

There is provided a system and method of automatic optimization of an examination recipe. The method includes obtaining one or more inspection images each representative of at least a portion of the semiconductor specimen, the one or more inspection images being indicative of respective defect candidates selected from a defect map using a first classifier included in the examination recipe; obtaining label data respectively associated with the one or more inspection images and informative of types of the respective defect candidates; extracting inspection features characterizing the one or more inspection images; retraining the first classifier using the first features and the label data, giving rise to a second classifier; and optimizing the examination recipe by replacing the first classifier with the second classifier; wherein the optimized examination recipe is usable for examining a subsequent semiconductor specimen.

20 Claims, 7 Drawing Sheets

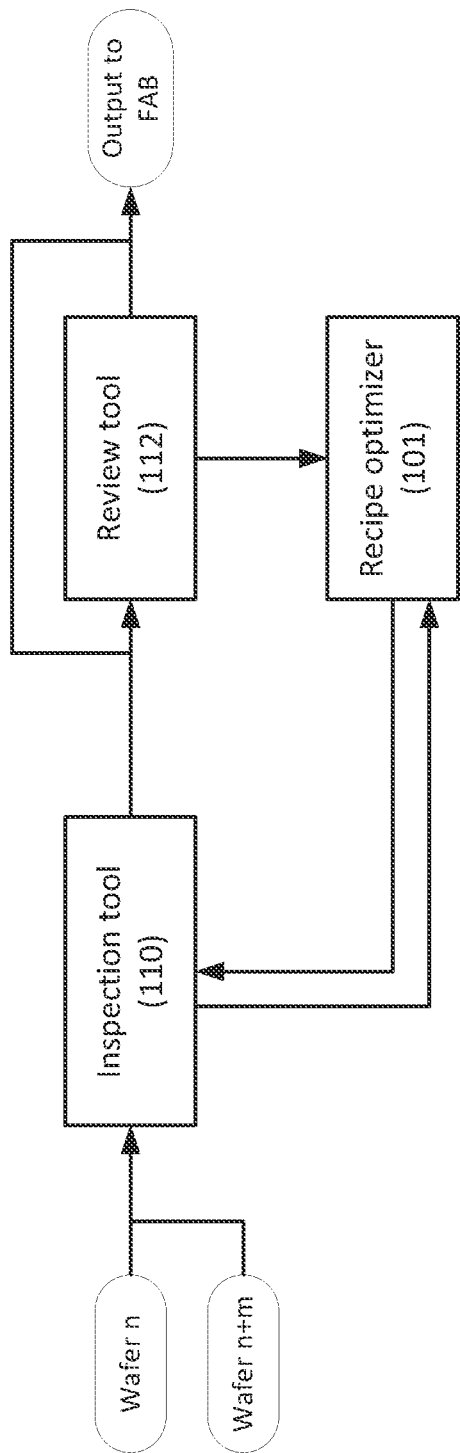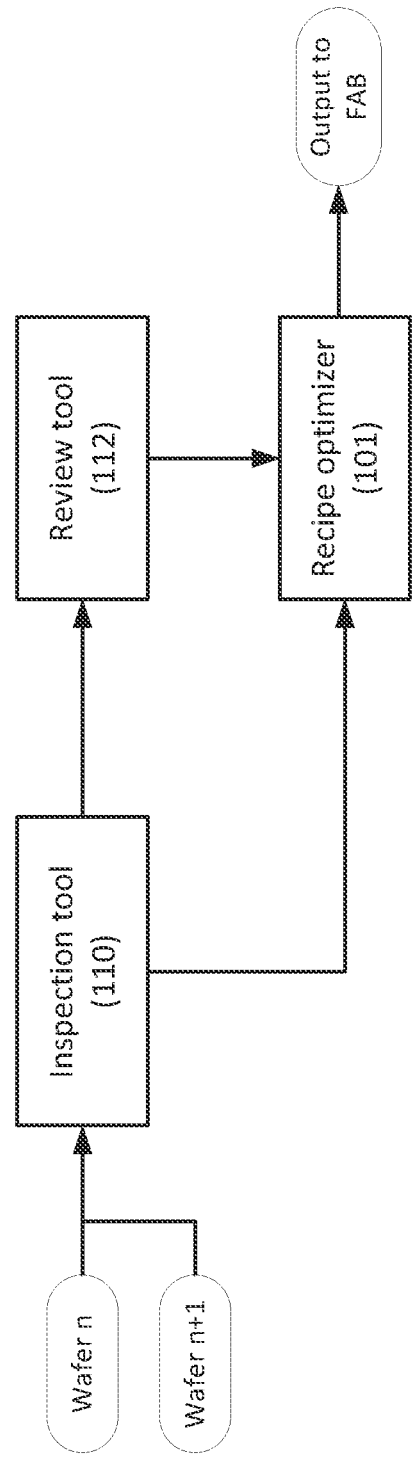
FIG. 5A
FIG. 5B

AUTOMATIC OPTIMIZATION OF AN EXAMINATION RECIPE

RELATED APPLICATIONS

This application is a continuation of U.S. patent application Ser. No. 16/995,728, filed Aug. 17, 2020, the entire contents of which are hereby incorporated by reference herein.

TECHNICAL FIELD

The presently disclosed subject matter relates, in general, to the field of examination of a specimen, and more specifically, to optimization of an examination recipe.

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

By way of non-limiting example, run-time examination can employ a two-phase procedure, e.g. inspection of a specimen followed by review of sampled locations of potential defects. Examination generally involves generating certain output (e.g., images, signals, etc.) for a specimen by directing light or electrons to the wafer and detecting the light or electrons from the wafer. During the first phase, the surface of a specimen is inspected at high-speed and relatively low-resolution. Defect detection is typically performed by applying a defect detection algorithm to the inspection output. A defect map is produced to show suspected locations on the specimen having high probability of a defect. Most often, the goal of inspection is to provide high sensitivity to detect defects of interest, while suppressing detection of nuisance and noise on the wafer. During the second phase, at least some of the suspected locations are more thoroughly analyzed with relatively high resolution. In some cases both phases can be implemented by the same inspection tool, and, in some other cases, these two phases are implemented by different inspection tools.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), image segmentation, automated metrology-related operations, etc.

SUMMARY

In accordance with certain aspects of the presently disclosed subject matter, there is provided a computerized system of automatic optimization of an examination recipe usable for examining a semiconductor specimen, the system comprising: a storage unit configured to store i) one or more inspection images each representative of at least a portion of the semiconductor specimen, the one or more inspection images being indicative of respective defect candidates selected from a defect map using a first classifier included in the examination recipe; ii) label data respectively associated with the one or more inspection images and informative of types of the respective defect candidates; and a processing and memory circuitry (PMC) operatively connected to the storage unit and configured to: extract inspection features characterizing the one or more inspection images; retrain the first classifier using the inspection features and the label data, giving rise to a second classifier; and optimize the examination recipe by replacing the first classifier with the second classifier; wherein the optimized examination recipe is usable for examining a subsequent semiconductor specimen.

In addition to the above features, the system according to this aspect of the presently disclosed subject matter can comprise one or more of features (i) to (xiv) listed below, in any desired combination or permutation which is technically possible:

(i). The defect map can be generated by an inspection tool and can be indicative of defect candidate distribution on the semiconductor specimen.

(ii). The label data can be generated by a review tool, comprising: capturing one or more review images at locations of the respective defect candidates, and reviewing the one or more review images to obtain the label data associated therewith.

(iii). Each of the types of the respective defect candidates is indicative of at least one of the following: defect of interest (DOI), nuisance, and a class of a respective defect candidate.

(iv). The inspection features comprise first features extracted by an unsupervised model previously trained using a set of training inspection images to extract representative features thereof.

(v). The first classifier is previously trained using one or more training inspection images of the set of training inspection images with respectively associated label data.

(vi). The inspection features can further comprise second features extracted by a supervised model, the supervised model previously trained using one or more training inspection images of the set of training inspection images with respectively associated label data to determine types of defect candidates.

(vii). The second features comprise at least one of i) feature vectors characterizing the one or more inspection images, and ii) label prediction features indicative of probability of each given defect candidate on an inspection image belonging to a specific type.

(viii). The PMC can be configured to retrain the first classifier using third features comprising at least one of the following: tool features, defect features and specimen features, in addition to the inspection features and the label data.

(ix). The PMC can be further configured to retrain the unsupervised model and/or the supervised model using the one or more inspection images and the label data, prior to the retraining of the first classifier.

(x). The PMC can be further configured to determine whether to optimize the examination recipe based on one or more parameters, and perform the optimizing and using in response to a positive determination.

(xi). The one or more parameters can comprise recipe update frequency, recipe performance history, customer policy, and situational analysis.

(xii). The examination recipe further comprises at least an additional first classifier, and the PMC is further configured to perform the obtaining, extracting and retraining for generating at least an additional second classifier corresponding to the at least additional first classifier, and optimize the examination recipe with the second classifier and the at least additional second classifier.

(xiii). The storage unit can store a plurality of inspection images captured by multiple inspection tools, and the retraining of the first classifier is in accordance with a working point selected based on a plurality of performance parameters including a tool-to-tool difference parameter indicative of variance between the multiple inspection tools.

(xiv). The specimen can comprise multiple layers, and the PMC is configured to perform the extracting, retraining and optimizing for the examination recipe for each layer, and the PMC is further configured to train a general-purpose classifier based on training data from the multiple layers, wherein the general-purpose classifier is usable to perform classification for one or more new layers.

In accordance with other aspects of the presently disclosed subject matter, there is provided a method of automatic optimization of an examination recipe usable for examining a semiconductor specimen, the method comprising: obtaining one or more inspection images each representative of at least a portion of the semiconductor specimen, the one or more inspection images being indicative of respective defect candidates selected from a defect map using a first classifier included in the examination recipe; obtaining label data respectively associated with the one or more inspection images and informative of types of the respective defect candidates; extracting inspection features characterizing the one or more inspection images; retraining the first classifier using the first features and the label data, giving rise to a second classifier; and optimizing the examination recipe by replacing the first classifier with the second classifier; wherein the optimized examination recipe is usable for examining a subsequent semiconductor specimen.

This aspect of the disclosed subject matter can comprise one or more of features (i) to (xiv) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of automatic optimization of an examination recipe usable for examining a semiconductor specimen, the method comprising: obtaining one or more inspection images each representative of at least a portion of the semiconductor specimen, the one or more inspection images being indicative of respective defect candidates selected from a defect map using a first classifier included in the examination recipe; obtaining label data respectively associated with the one or more inspection images and informative of types of the respective defect candidates; extracting inspection features characterizing the one or more inspection images; retraining the first classifier using the first features and the label data, giving rise to a second classifier; and optimizing the examination recipe by replacing the first classifier with the second classifier; wherein the optimized examination recipe is usable for examining a subsequent semiconductor specimen.

This aspect of the disclosed subject matter can comprise one or more of features (i) to (xiv) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which:

FIGS. 5A and 5B illustrate two schematic diagrams of the recipe optimizer implementation with respect to the inspection tool and review tool in accordance with certain embodiments of the presently disclosed subject matter.

DETAILED DESCRIPTION OF THE DRAWINGS

Figure 1:
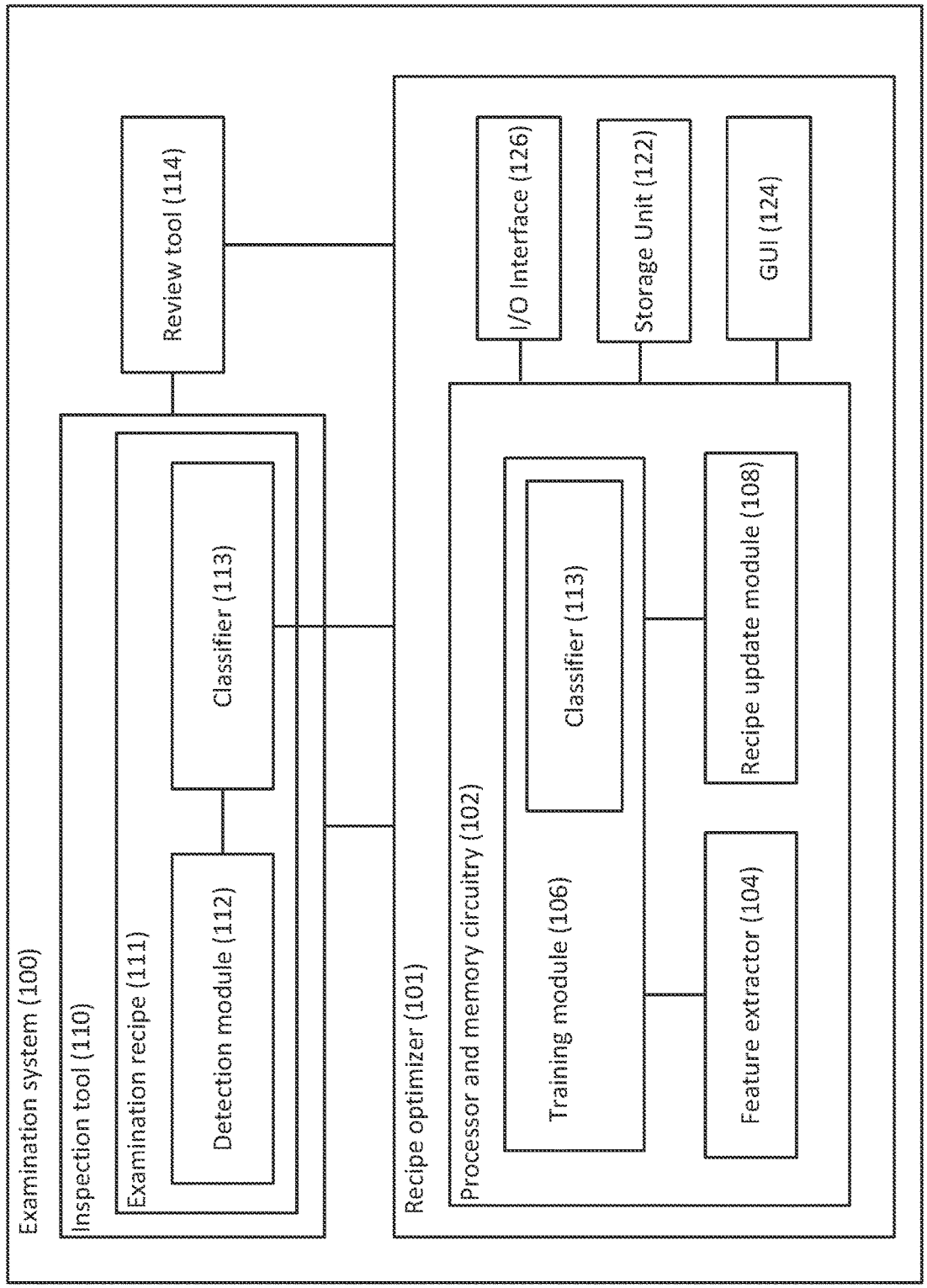
FIG. 1 illustrates a functional block diagram of an examination system for examining a semiconductor specimen and a system for automatic optimization of an examination recipe usable by the examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "examining", "obtaining", "extracting", "retraining", "optimizing", "determining", "generating", "training", "capturing", "reviewing", "performing", "storing", "selecting", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the recipe optimization system and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of physical objects or substrates including wafers, masks, reticles, and other structures, combinations and/or parts thereof used for manufacturing semiconductor integrated circuits, magnetic heads, flat panel displays, and other semiconductor-fabricated articles. A specimen is also referred to herein as a semiconductor specimen, and can be produced by manufacturing equipment executing corresponding manufacturing processes.

The term "examination" used in this specification should be expansively construed to cover any kind of operations related to detection and/or classification of defects in a specimen, as well as metrology-related operations during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof, using the same or different inspection tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes (SEM), atomic force microscopes (AFM), optical inspection tools, etc.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system for examining a semiconductor specimen and a system for automatic optimization of an examination recipe usable by the examination system in accordance with certain embodiments of the presently disclosed subject matter.

The examination system 100 illustrated in FIG. 1 can be used for examination of a semiconductor specimen (e.g. a wafer and/or parts thereof) as a part of the specimen fabrication (FAB) process. The system 100 can examine the semiconductor specimen using an examination recipe. The term "examination recipe" used herein should be expansively construed to cover any kind of recipe that can be used for examining a specimen, including recipe(s) usable for inspection, detection, classification as well as metrology related operations, etc. The examination system 100 can include one or more examination tools configured to capture images and/or to review the captured image(s) and/or to enable or provide measurements related to the captured image(s).

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof. Examination tools can include inspection tool(s) and/or review tool(s). An inspection tool is configured to scan a specimen (e.g., an entire wafer, an entire die or portions thereof) to capture inspection images (typically, at relatively high-speed and/or low-resolution) for detection of potential defects. A review tool is configured to capture review images of at least some of the defects detected by the inspection tool(s) for ascertaining whether a potential defect is indeed a defect. Such a review tool is usually configured to inspect fragments of a die, one at a time (typically, at relatively low-speed and/or high-resolution). Inspection tool and review tool can be different tools located at the same or at different locations, or a single tool operating in two different modes. In some cases, at least one examination tool can have metrology capabilities.

According to certain embodiments, the examination system 100 can include one or more inspection tools 110 and one or more review tools 114 as illustrated in FIG. 1. The inspection tool 110 is configured to use an examination recipe 111 to detect defects on the specimen. By way of example, the examination recipe 111 can be an inspection recipe including the functionalities of defect detection and classification (illustrated in FIG. 1 as a detection module 112 and a classifier module 113). The examination recipe, as well as the functional modules comprised therein, can be implemented as computer-readable instructions embodied on a non-transitory computer-readable memory comprised in a processor or processing unit (not illustrated separately in FIG. 1) in the inspection tool 110. The processor can be configured to execute the functional modules in accordance with the computer-readable instructions to perform the defect detection.

Specifically, the inspection tool 110 can scan the specimen to capture inspection images and detect potential defects in accordance with the defect detection module 112. The output of the detection module is a defect map indicative of defect candidate distribution on the semiconductor specimen. The classifier 113 is configured to select a list of defect candidates from the defect map as candidates having higher probability to be defects of interest (DOI). Details of the defect detection module and the classifier module are described below with reference to FIG. 2.

The term "defect of interest (DOI)" used herein refers to any real defects that are of the user's interest to be detected. For instance, any "killer" defects that may cause yield loss can be indicated as DOI, in comparison to the nuisance type of defects which are also real defects, but do not impact yield, and therefore should be ignored.

The term "nuisance" used herein should be expansively construed to include any unwanted or not-of-interest defects, as well as random noises that are caused by different variations (e.g., process variation, color variation, mechanical and electrical variations, etc.) during inspection. Nuisance is sometimes also referred to as false alarms.

The list of defect candidates, as selected by the classifier, can be provided to the review tool 113. The review tool 113 is configured to capture review images at locations of the respective defect candidates in the list, and review the review images for ascertaining whether a defect candidate is indeed a DOI. The output of the review tool can include label data respectively associated with the list of defect candidates, the label data informative of types of the defect candidates.

Without limiting the scope of the disclosure in any way, it should also be noted that the inspection tool(s) 110 and/or the review tool(s) 114 can be implemented as examination machines of various types, such as optical imaging machines, electron beam machines and so on. In some cases, the same examination tool can provide low-resolution image data and high-resolution image data.

According to certain embodiments, the inspection images and/or the review images can be selected from a group comprising: a plurality of images of the specimen captured during the manufacturing process, and derivatives of the captured images obtained by various pre-processing stages. By way of example, the inspection images can be images of a part of a wafer or a photomask captured by an optical inspection tool or SEM. By way of another example, the review images can be one or more of the following: SEM images roughly centered around the defect to be classified by ADC, SEM images of larger regions in which the defect is to be localized by ADR, registered images of different examination modalities corresponding to the same mask location, segmented images, height map images, etc. It is to be noted that in some cases the inspection images and/or the review images can include image data (e.g. captured images, processed images, etc.) and associated numeric data (e.g. metadata, hand-crafted attributes, etc.). It is further noted that image data can include data related to a layer of interest and/or to one or more layers of the specimen.

According to certain embodiments of the presently disclosed subject matter, the examination system 100 can comprise a computer-based system 101 capable of automatically optimizing an examination recipe using examination data obtained from the examination tools. System 101 is thus also referred to herein as recipe optimization system or recipe optimizer. System 101 can be operatively connected to the one or more inspection tools 111 and one or more review tools 114, as illustrated in FIG. 1.

System 101 includes a processor and memory circuitry (PMC) 102 (also referred to as processing unit) operatively connected to a hardware-based I/O interface 126. PMC 102 is configured to provide necessary processing for operating the system 101 as further detailed with reference to FIG. 2 and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

According to certain embodiments, functional modules comprised in the PMC 102 can include a feature extractor 104, a training engine 106, a classifier 113, and a recipe update module 108. The PMC 102 can be configured to receive, e.g., from the inspection tool 110, via the I/O interface 126, one or more inspection images each representative of at least a portion of the semiconductor specimen. The one or more inspection images are indicative of respective defect candidates selected from a defect map using a classifier 113 (also referred to as a first classifier) included in the examination recipe 111. The PMC 102 can be configured to receive, e.g., from the review tool 114, label data respectively associated with the one or more inspection images and informative of types of the respective defect candidates.

The feature extractor 104 can be configured to extract inspection features characterizing the one or more inspection images. In some cases, the feature extractor can be implemented as an unsupervised learning model, while in some other cases, the feature extractor can be implemented as a supervised learning model, as will be detailed below with reference to FIG. 2. The training engine 106 can be configured to retrain the first classifier 113 using the first features and the label data, giving rise to a second classifier. The recipe update module 108 can be configured to optimize the examination recipe by replacing the first classifier with the second classifier. And the inspection tool 110 can use the optimized examination recipe for examining a subsequent semiconductor specimen.

It is to be noted that the term "first" as used throughout the specification, figures and claims, does not mean the very first instance/entity, etc. Rather it is used to distinguish from a "second" instance/entity, etc. By way of example, the second classifier is a classifier that is retrained and updated based on the first classifier, thus being different from the first classifier. In certain embodiments of the present disclosure, the terms "a classifier" and "an updated classifier" are used equivalently as the terms of "first classifier" and "second classifier". By way of another example, the second features refer to features that are different from the first features.

Operation of system 100, system 101, PMC 102 and the functional modules therein will be further detailed with reference to FIG. 2.

According to certain embodiments, system 101 can comprise a storage unit 122. The storage unit 122 can be configured to store any data necessary for operating system 101, e.g., data related to input and output of system 101, as well as intermediate processing results generated by system 101. By way of example, the storage unit 122 can be configured to store images and/or derivatives thereof produced by the examination tools, as well as label data associated therewith. In some embodiments, the storage unit 122 can be configured to store training data for training the classifier and/or other machine learning models. Accordingly, the stored data can be retrieved from the storage unit 122 and provided to the PMC 102 for further processing.

In some embodiments, system 101 can optionally comprise a computer-based graphical user interface (GUI) 124 which is configured to enable user-specified inputs and/or render processing outputs related to system 101. For instance, the user can be presented with a visual representation of the specimen (for example, by a display forming part of GUI 124), including image data of the specimen. Optionally, the user may be provided, through the GUI, with options of defining certain operation parameters. The user may also view certain operation results, such as, e.g., the defect map, the label data, the classifier output, e.g., the list of defect candidates, etc., on the GUI. System 101 is further configured to send, via I/O interface 126, an updated classifier to the inspection tool. In some cases, system 101 can be further configured to send some of the results to the storage unit 122, and/or external systems (e.g. Yield Management System (YMS) of a FAB).

According to certain embodiments, the machine learning models referred to herein, such as the feature extractor, the classifier, etc., can be implemented as various types of machine learning models, such as, e.g., statistical models, neural networks, decision trees, support vector machines, and genetic models, or ensembles/combinations thereof etc. The learning algorithm used by the learning model can be any of the following: supervised learning, unsupervised learning, or semi-supervised learning, etc. By way of example, the feature extractor can be implemented as an unsupervised model or a supervised model. The presently disclosed subject matter is not limited to the specific type or learning algorithm used by the learning models.

In some embodiments, one or more of the learning models can be implemented as a deep neural network (DNN) which includes layers organized in accordance with respective DNN architecture. By way of non-limiting example, the layers of DNN can be organized in accordance with Convolutional Neural Network (CNN) architecture, Recurrent Neural Network architecture, Recursive Neural Networks architecture, Generative Adversarial Network (GAN) architecture or otherwise. Optionally, at least part of the layers can be organized in a plurality of DNN sub-networks. Each layer of DNN can include multiple basic computational elements (CE) typically referred to in the art as dimensions, neurons, or nodes.

Generally, CEs of a given layer can be connected with CEs of a preceding layer and/or a subsequent layer. Each connection between the CE of a preceding layer and the CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. The activation function can be, for example, an identity function, a deterministic function (e.g., linear, sigmoid, threshold, or the like), a stochastic function, or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of a DNN can be initially selected prior to training, and can be further iteratively adjusted or modified during training to achieve an optimal set of weighting and/or threshold values in a trained DNN. After each iteration, a difference can be determined between the actual output produced by DNN and the target output associated with the respective training set of data. The difference can be referred to as an error value. Training can be determined to be complete when a cost function indicative of the error value is less than a predetermined value, or when a limited change in performance between iterations is achieved. Optionally, at least part of DNN subnetworks (if any) can be trained separately prior to training the entire DNN.

Each machine learning model has a set of parameters (such as, e.g., the weighting and/or threshold values of the DNN as described above) that are calculated as part of the training phase. A set of DNN input data used to adjust the weights/thresholds of a deep neural network is referred to hereinafter as a training set or training dataset or training data. As aforementioned, the training of the learning models can be performed by the training module 106 during training phase, as will be detailed below with reference to FIG. 3.

It is noted that the above illustrated DNN architecture is for exemplary purposes only and is only one possible way of implementing the machine learning models, and the teachings of the presently disclosed subject matter are not bound by the specific model and architecture as described above.

According to certain embodiments, in addition to the classifier 113, the inspection tool 110 can comprise one or more additional post-processing modules such as additional classifiers, filters, etc., and the recipe optimization system 101 can be used to optimize these modules in a similar manner. In some cases, the examination system 100 can comprise one or more systems 101 for respectively updating one or more post-processing modules as comprised in the examination recipe. In some embodiments, system 101 can be used for optimizing the recipe usable for the review tool 114.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the system illustrated in FIG. 1 can be implemented in a distributed computing environment, in which the aforementioned functional modules shown in FIG. 1 can be distributed over several local and/or remote devices, and can be linked through a communication network. It is further noted that in another embodiment at least some of the storage unit 122 and/or GUI 124 can be external to the system 101 and operate in data communication with system 101 via I/O interface 126. System 101 can be implemented as stand-alone computer(s) to be used in conjunction with the examination tools. Alternatively, in some cases, the respective functions of the system 101 can, at least partly, be integrated with one or more examination tools, thereby facilitating and enhancing the functionalities of the examination tools in examination related processes.

The examination recipe used for examining semiconductor specimens nowadays, has high complexity, and the current recipe assessment and tuning process is usually done manually based on FAB data and/or customer feedback, and is thus considerably time consuming and inefficient. By way of example, evaluation of an inspection recipe typically needs to wait until receiving label data from a review tool which is costly in terms of time and resources. In addition, recipe setup is typically done at a given time on a given wafer. In most cases, the given wafer used during setup cannot represent all the DOI types and noise regimes that will be encountered during production, thus causing the runtime examination results to be less optimal due to wafer/process variations.

Machine learning technology has recently been used to aid the examination process, however applying machine learning techniques for wafer inspection generally requires a sufficient amount of training data, and the current data sharing scheme between various examination tools (e.g., between inspection tools and review tools) is technically cumbersome and in some cases causes data inaccessibility and insufficiency during the training phase.

Certain embodiments of the presently disclosed subject matter enable automatic and efficient recipe optimization by using a retraining process in parallel to the online inspection and detection flow. The retraining process is based on features extracted from runtime inspection images as well as label data corresponding thereto, as will be further explained below with reference to FIG. 2. The methods are machine learning based, with minimal user calibration and interaction.

For purpose of illustration only, certain embodiments of the present disclosure are provided with respect to wafers. Embodiments are, likewise, applicable to other types of specimens in a similar manner.

Figure 2:
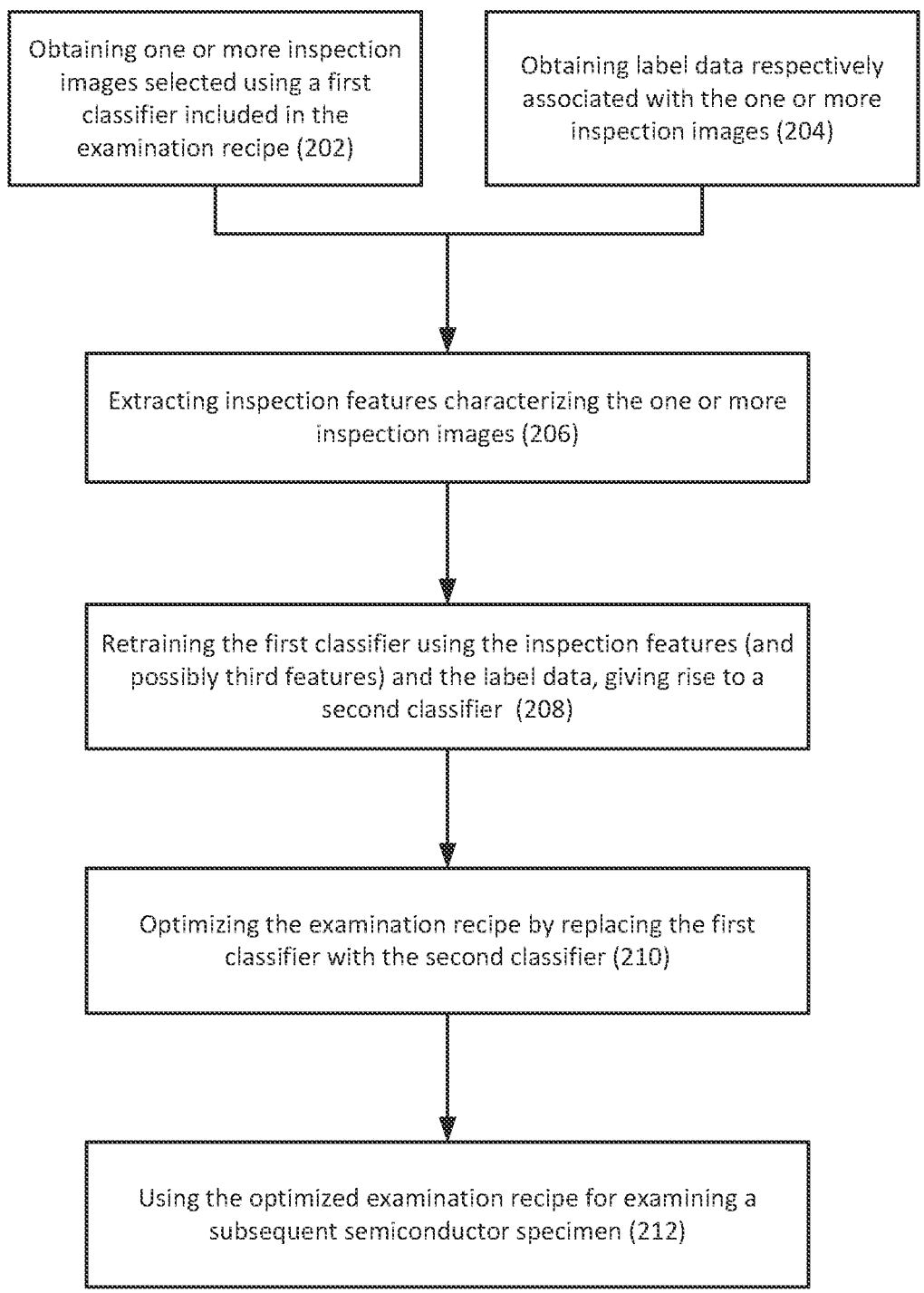
FIG. 2 illustrates a generalized flowchart of automatic optimization of an examination recipe usable for examining a semiconductor specimen in accordance with certain embodiments of the presently disclosed subject matter.

Referring to FIG. 2, there is illustrated a generalized flowchart of automatic optimization of an examination recipe usable for examining a semiconductor specimen in accordance with certain embodiments of the presently disclosed subject matter.

One or more inspection images can be obtained (202) (e.g., by the PMC 102 in system 101). The inspection images can be received from the inspection tool 110 via the I/O interface 126, or retrieved from the storage unit 122. Each inspection image represents at least a portion of the semiconductor specimen. The one or more inspection images are indicative of respective defect candidates selected from a defect map using a first classifier included in an examination recipe.

As aforementioned, the inspection images are captured by the inspection tool. According to certain embodiments, the inspection tool can be configured to capture an inspection image of the specimen (e.g., a wafer or a die or part thereof). The inspection image can result from different examination modality(s), and the present disclosure is not limited by the inspection and metrology technology used for generating the image. The captured image of the specimen can be processed using a defect detection module (such as the detection module 112 illustrated in FIG. 1) comprised in the examination recipe (whose functionality can be integrated within a processing unit of the inspection tool) in order to generate a defect map indicative of defect candidate distribution on the specimen (i.e., suspected locations on the specimen having high probability of being a defect of interest (DOI)).

Different inspection and detection methodologies can be applied in the defect detection module for processing the inspection images and generating the defect map, such as Die-to-Die (D2D), Die-to-History (D2H), Die-to-Database (D2DB), etc., and the present disclosure is not limited by specific detection technologies used therein. For illustrative purposes only, there are now described a few non-limiting examples of defect detection and defect map generation based on the inspection image.

In some embodiments, for each inspection image, one or more reference images can be used for defect detection. The reference images can be obtained in various ways, and the number of reference images used herein and the way of obtaining such images should not be construed to limit the present disclosure in any way. In some cases, the one or more reference images can be captured from one or more dies of the same specimen (e.g., neighboring dies of the inspection die). In some other cases, the one or more reference images can include one or more images captured from one or more dies of another specimen (e.g., a second specimen that is different from the present specimen but shares the same design data). By way of example, in Die-to-History (D2H) inspection methodology, the inspection image can be captured from a present specimen at a present time (e.g., t=t'), and the one or more reference images can include one or more previous images captured from one or more dies on a second specimen at a baseline time (e.g., a previous time t=0). In some further embodiments, the one or more reference images can include at least one simulated image representing a given die of the one or more dies. By way of example, a simulated image can be generated based on design data (e.g., CAD data) of the die.

In some embodiments, at least one difference image can be generated based on the difference between pixel values of the inspection image, and pixel values derived from the one or more reference images. Optionally, at least one grade image can also be generated based on the at least one difference image. In some cases, the grade image can be constituted by pixels with values computed based on corresponding pixel values in the difference image and a predefined difference normalization factor. The predefined difference normalization factor can be determined based on behavior of a normal population of pixel values and can be used to normalize the pixel values of the difference image. By way of example, the grade of a pixel can be calculated as a ratio between a corresponding pixel value of the difference image and the predefined difference normalization factor. The defect map can be generated by determining locations of suspected defects based on the at least one difference image or the at least one grade image using a detection threshold.

In some embodiments, the generated defect map can be informative of a set of defect candidates each associated with one or more defect characteristics including, such as, e.g., locations, strength and size of the respective defect candidate, etc.

A list of defect candidates can be selected, using a classifier module (such as the classifier module 113 illustrated in FIG. 1) as comprised in the examination recipe, from the defect map as candidates having higher probability to be defects of interest (DOI).

The term "classifier", "classifier module" or "classification module" referred to herein should be broadly construed to cover any learning model capable of identifying to which of a set of categories/classes a new instance belongs, on the basis of a training set of data. By way of example, the classifier can classify the defect candidates into two types: DOI or nuisance. In such cases, the classifier is a binary classifier and can also be referred to as a filter or a nuisance filter which is configured to filter out nuisance type of defect candidates from the defect map. By way of another example, the classifier can identify specific defect classes of the defect candidates, such as, e.g., a bridge, particle, etc. By way of further example, the classifier can classify the defect candidates into DOI and nuisance, and for the candidates classified as DOI, the classifier can also identify the specific defect class thereof (sub-type of DOI). The classifier can be implemented as various types of machine learning models, such as, e.g., Linear classifiers, Support vector machines (SVM), neural networks, decision trees, etc., and the present disclosure is not limited by the specific model implemented therewith.

According to certain embodiments, the classifier performs the selection/classification on the set of defect candidates in the defect map based on input features/attributes characterizing the inspection image. Specifically, for each of the defect candidates, a surrounding image patch (i.e., an image patch surrounding the location of each given defect candidate) can be extracted respectively from the inspection image of the specimen, giving rise to a set of inspection image patches corresponding to the set of defect candidates. By way of example, the image patch can be extracted in accordance with a predefined shape and size. Certain features characterizing the inspection image patches can be extracted and used as input for the classifier, as described below with reference to step 206. The classifier can perform classification for each defect candidate based on the features extracted from the corresponding inspection image patch. The output of the classifier can be a list of defect candidates selected by the classifier as having a higher probability of being DOI (also referred to as a selected list or selected defect candidates). In order for the classifier to be able to select/classify the defect candidates based on the extracted features, it needs to be properly trained prior to being put into production, as described in further detail below with reference to step 208 and FIG. 3.

The list of defect candidates, as selected by the classifier, can be provided to a review tool (such as, e.g., the review tool 113 as illustrated in FIG. 1). The review tool can capture review images at locations of the selected defect candidates, and review the review images for ascertaining whether a defect candidate is a DOI or nuisance. The output of the review tool can include label data respectively associated with the list of defect candidates. The label data are informative of types of the defect candidates and can be used for the training of the classifier and/or other machine learning models, as described in further detail below with reference to step 208 and FIG. 3.

Continuing with the description of FIG. 2, in order to timely and effectively optimize the examination recipe, e.g., to update the classifier so that it can perform the classification of DOIs with higher accuracy and capture rate, the presently disclosed subject matter proposes to apply an off-line optimization process in parallel to the examination process performed by the examination tool (e.g., the recipe optimization process performed by system 101 is in parallel to/separate from the defect detection process performed by the inspection tool 110 using the examination recipe 111 and the defect review process performed by the review tool 114, as illustrated in FIG. 1). According to certain embodiments, the recipe optimization system collects up-to-date production data and feedback information from the tools, and uses the collected data to re-train the classifier, and the re-trained classifier can replace the previous classifier in the examination recipe, giving rise to an optimized/updated recipe which is used for examining the subsequent specimen. In such ways the classifier is frequently and automatically updated based on the up-to-date production data, thus being more robust to wafer/process variation, etc.

Specifically, in step 202 the one or more inspection images received by the recipe optimization system 101 from the inspection tool 110 are in fact one or more inspection image patches corresponding to the list of defect candidates selected by the classifier, as described above. Each inspection image patch is extracted from the inspection image of the specimen (e.g., surrounding the location of each given defect candidate) and thus represents at least a portion of the specimen. The one or more inspection image patches are indicative of the selected defect candidates.

The recipe optimization system 101 also obtains (204) (e.g., by the PMC 102 in system 101) the label data respectively associated with the one or more inspection images (i.e., inspection image patches). The label data serves as feedback information and ground truth data for the inspection images. The label data can be received from the review tool 114 or the storage unit 122, and are informative of types of the respective defect candidates, as described above.

Inspection features characterizing the one or more inspection images can be extracted (206) (e.g., by the feature extractor 104 in the PMC 102). According to certain embodiments, the inspection features can comprise first features extracted by an unsupervised model. In some cases, additionally or alternatively to the first features, the inspection features can comprise second features extracted by a supervised model. By way of example, the second features can comprise at least one of the following: i) feature vectors characterizing the one or more inspection images, and ii) label prediction features indicative of probability of each defect candidate on an inspection image belonging to a specific type/class (e.g., probability of each defect candidate being a DOI).

In some further cases, additionally or alternatively to the inspection features including the first features and/or the second features, the classifier can be retrained using additional third features, such as, e.g., tool features characterizing physical attributes of an inspection tool that captures the one or more inspection images. The tool features can be derived directly from the inspection tool. The third features can also comprise defect features and/or specimen features, as will be described in further detail below.

The inspection features characterizing the one or more inspection images, as extracted in various ways as described above, together with the ground truth data, i.e., the label data associated with the inspection images, are provided as training data for re-training (206) (e.g., by the training module 106 as illustrated in FIG. 1) the classifier. Note that the classifier 113 as illustrated in system 101 should be regarded as an offline version of the classifier 113 which is comprised in the examination recipe 111 used by the inspection tool 110 for inspecting the specimen and detecting defect candidates. The classifier is previously trained, during a training phase, using one or more training inspection images and label data associated therewith, as described below in further detail with reference to FIG. 3.

Figure 4:
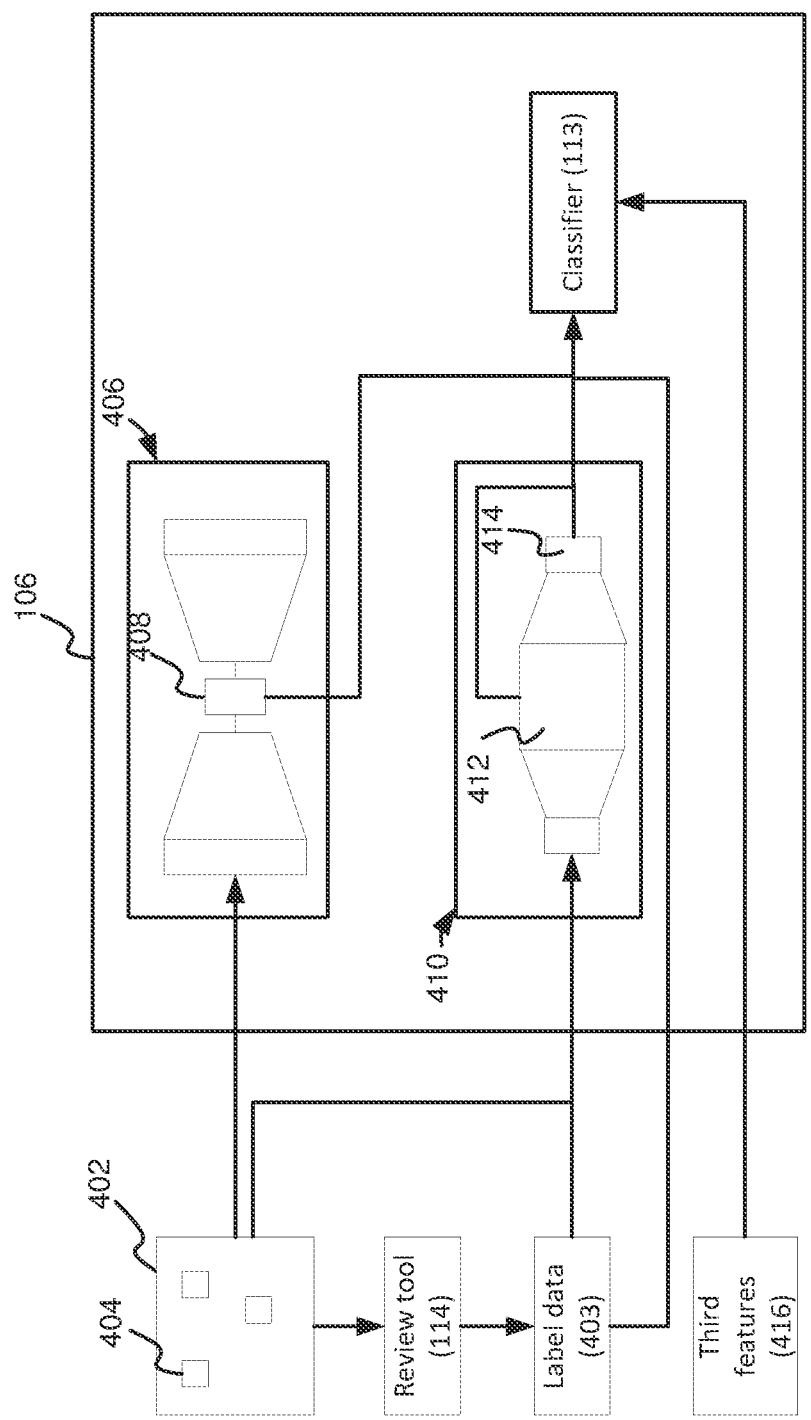
FIG. 4 illustrates a schematic diagram of re-training the classifier in accordance with certain embodiments of the presently disclosed subject matter.

Referring now to FIG. 4, there is illustrated a schematic diagram of re-training the classifier in accordance with certain embodiments of the presently disclosed subject matter.

The inspection tool captures an inspection image 402 of a specimen (e.g., a wafer or a die). After performing defect detection and classification using the examination recipe, a list of defect candidates are selected by a classifier from the defect map, and one or more inspection image patches 404 are extracted from the inspection image 402 corresponding to the selected defect candidates. For instance, the image patches 404 are extracted as a window surrounding the location of each given defect candidate. The selected defect candidates are provided to the review tool 114 and label data 403 informative of types of respective defect candidates can be generated by the review tool 114, as described above. The label data is respectively associated with the selected defect candidates of the one or more inspection image patches.

In some embodiments, the one or more image patches 404 are fed into an unsupervised model 406 to extract representative features thereof. By way of example, the unsupervised model 406 can be implemented as an autoencoder or variations thereof. Autoencoder is a type of neural network commonly used for the purpose of data reproduction by learning efficient data coding and reconstructing its inputs (e.g., minimizing the difference between the input and the output). The autoencoder has an input layer, an output layer and one or more hidden layers connecting them. Generally an autoencoder can be regarded as including two parts, the encoder and the decoder. The autoencoder learns to compress data from an input layer into a short code (i.e., the encoder part), and then decompress that code into an output that closely matches the original data (i.e., the decoder part). The output of the encoder is referred to as code, latent variables, or latent representation 408 representative of the input image. The code can pass the hidden layers in the decoder and can be reconstructed to an output image corresponding to the input image in the output layer.

Once the autoencoder is trained based on a set of training inspection images (as described below in detail with reference to FIG. 3), the trained autoencoder is capable of generating, for each input image, a reconstructed output image that closely matches the input based on the latent representation thereof. Thus, in the present case, for each inspection image patch fed into the autoencoder, the code or the latent representation 408 generated by the autoencoder can be used as the extracted features representing the inspection image patch. The features extracted by the unsupervised model are also referred to herein as first features and can be provided as part of the input to the classifier 113 for retraining purposes. In some embodiments, additionally, the reconstructed output image, in some cases together with the input image, can also be provided as part of the input to the classifier 113 for retraining purposes.

It is to be noted that the above example of autoencoder is described for exemplary and illustrative purposes only, and should not be regarded as limiting the present disclosure in any way. Other types of unsupervised models can be used in addition to or in lieu of the above. By way of example, any density estimation method can be used, such as, e.g., a statistical graphical model (e.g., Normalizing flow models, Auto regressive models, Bayesian networks, Markov networks, etc.), or a non-graphical model (e.g., Variational inference models, Gaussian mixture models, etc.).

In some embodiments, additionally or alternatively, the one or more image patches 404 can be fed into a supervised model 410. The supervised model 410 can be implemented in various machine learning models such as, e.g., CNN, SVM, etc. with supervised learning mode. In some embodiments, the supervised model can be implemented as a classification model trained to learn features and classify data. During the training phase of the supervised model 410, the label data 403 generated by the review tool 114 is provided to the supervised model as ground truth. The supervised model 410 can be trained using one or more training inspection images of the set of training inspection images and the respectively associated label data, as described below in detail with reference to FIG. 3. Once trained, the trained supervised model 410 is capable of extracting features and using the features to determine/classify types of defect candidates.

In one example, the supervised model can be implemented as a convolutional neural network (CNN). CNN normally has a structure comprising an input and an output layer, as well as multiple hidden layers. The hidden layers of a CNN typically comprise a series of convolutional layers that convolve with a multiplication or other dot product, subsequently followed by additional layers such as pooling layers, fully connected layers, and normalization layers, etc. In some cases, a CNN can be regarded as being composed of two main functionalities: feature extraction and classification. By way of example, the feature extraction part can include several convolutional layers followed by max-pooling and an activation function. The classification part usually includes fully connected layers.

By way of example, in some cases, certain intermediate layers (e.g., one or more of the convolutional layers) in the feature extraction part of the supervised model can provide layer output in the form of feature maps (also termed as feature vectors), and one or more of such output feature maps can be used as extracted features to be provided to the classifier.

For instance, the output feature maps can be generated, e.g., by convolving each filter of a specific layer across the width and height of the input feature maps, computing the dot product between the entries of the filter and the input, and producing a two-dimensional activation map which gives the responses of that filter at every spatial position. Stacking the activation maps for all filters along the depth dimension forms the full output feature maps of the convolution layer. As a result, the CNN learns of filters that activate when it detects some specific type of feature at some spatial position in the input. Thus the output feature maps can be regarded as comprising features extracted from and representative of the input. As exemplified in FIG. 4, one or more of such feature maps can be extracted from certain intermediate layers 412 of the supervised model 410 and can be provided as input to the training module 106 for retraining the classifier 113.

By way of another example, certain intermediate layers (e.g., one or more of the fully connected layers prior to the last layer) in the classification part of the supervised model can provide layer output including features indicative of label prediction probability, i.e., the probability of an input being assigned with a specific label. Such features are also referred to herein as label prediction features. In the present case, these features can be indicative of probability of each given defect candidate on an inspection image belonging to a specific type. In some cases, such layers are the last layers prior to the output layer, and the labels are determined based on the label prediction features outputted by these layers. According to certain embodiments, such label prediction features can be used as extracted features to be provided to the classifier, additionally or alternatively to the feature maps as described above. As exemplified in FIG. 4, the label prediction features can be extracted from certain layers 414 (prior to the output layer) in the classification part of the supervised model 410 and provided as input to the training module 106 for retraining the classifier 113. The feature maps, and/or the label prediction features extracted by the supervised model are also referred to herein as second features, for the purpose of differentiating them from the other extracted features, such as the first features, or the third features.

According to certain embodiments, one or more third features 416 can also be extracted and provided to the training module 106 for retraining the classifier 113, in addition to the first features and/or second features. By way of example, the third features can include tool features characterizing physical attributes of the inspection tool which captures the one or more inspection images. Such tool features can include one or more of the following: one or more physical attributes of the detector, microscope, light scattering, etc.

In some embodiments, additionally or alternatively, the third features can include defect features such as, e.g., one or more attributes related to the size, shape and location, etc. of the defect candidates, etc. For instance, one of the defect features can be a location attribute which indicates whether the location of a defect candidate is closer to the center of the wafer or the edge of the wafer. Such defect features can provide additional defect information to the classifier. In another example, one defect feature can be a size attribute which indicates the size of a defect candidate. For a defect candidate with a size smaller than a predetermined size, the defect candidate can be correlated with a point-spread function which is configured to transfer a point in the wafer to a corresponding image representation thereof (i.e., how it would appear in the inspection image). This is because in some cases, the optical inspection tool cannot transfer all wafer data into the inspection image due to the limits of the tool resolution. Therefore, by correlating with the point-spread function, additional wafer information can be obtained and provided to the classifier. In some further embodiments, additionally or alternatively, the third features can include specimen features (e.g., wafer features) such as, e.g., wafer patterns, wafer electrical functions, etc.

According to certain embodiments, the feature extractor 104 as illustrated in FIG. 1 can be implemented as an unsupervised model (e.g., the unsupervised model 406 in FIG. 4) and the inspection features used to retrain the classifier can include the first features as extracted by the unsupervised model. In some embodiments, the feature extractor 104 can be implemented as a supervised model (e.g., the supervised model 410 in FIG. 4) and the inspection features used to retrain the classifier can include the second features as extracted by the supervised model, e.g., the feature maps, and/or the label prediction features. In some further embodiments, the feature extractor 104 can be implemented as comprising both the unsupervised model and the unsupervised model (e.g., both the unsupervised model 406 and the supervised model 410 in FIG. 4), and the inspection features used to retrain the classifier can include both the first features and the second features. In yet further embodiments, additionally and optionally, the feature extractor can comprise a tool feature extractor (not illustrated in FIG. 4) which is configured to extract third features 416 from the inspection tool.

It is to be noted that although the structure as illustrated in FIG. 4 includes the unsupervised model 406 and the supervised model 410 as well as the third features 416, which are all operatively connected to the classifier 113 for re-training purposes, this is for exemplary purposes only and should not be regarded as limiting the present disclosure in any way. Alternative system structure and implementation as described above (e.g., including only the supervised model, or only the unsupervised model, with or without the third features) can be implemented in lieu of the above. It is also to be noted that the schematic demonstration of certain functional modules, such as the unsupervised model 406 and the supervised model 410, is illustrated for non-limiting exemplary purposes only and does not intend to indicate the specific structure of such modules. Accordingly, various structural and/or functional changes/adaptation can be made to such modules without departing from the scope of the disclosure.

Upon collecting runtime data including the inspection features characterizing the one or more inspection images (i.e., inspection image patches) and the label data 403 respectively associated with the inspection images, the training module 106 can retrain the classifier 113 using the collected runtime data as training data. The re-trained classifier is capable of determining the probability of a defect candidate on an inspection image belonging to a specific type (e.g., DOI). As described above, the classifier 113 can be regarded as an offline version of the classifier used in the examination recipe for examining the current specimen and generating the selected defect candidates.

As described below with reference to FIG. 3, in some embodiments, the training module 106 can be further configured to re-train the unsupervised model and/or the supervised model in runtime using the runtime data (e.g., the one or more inspection images and possibly also the label data associated therewith), prior to re-training the classifier 113. By way of example, it can be determined that upon collecting new runtime data, the training module can be configured to re-train the supervised model using the runtime data, and once the supervised model is trained, to re-train the classifier using the features extracted by the supervised and unsupervised models and/or the third features. By way of another example, it can be determined to re-train both the supervised and unsupervised models in response to collection of new runtime data. By way of further example, it can also be determined to re-train the supervised model every time when there is new runtime data, and only re-train the unsupervised model every predetermined time interval (e.g., every n wafers). It is to be noted that in some cases the third features can be used to train the unsupervised model and/or the supervised model and/or the classifier, as described below with reference to FIG. 3.

Figure 3:
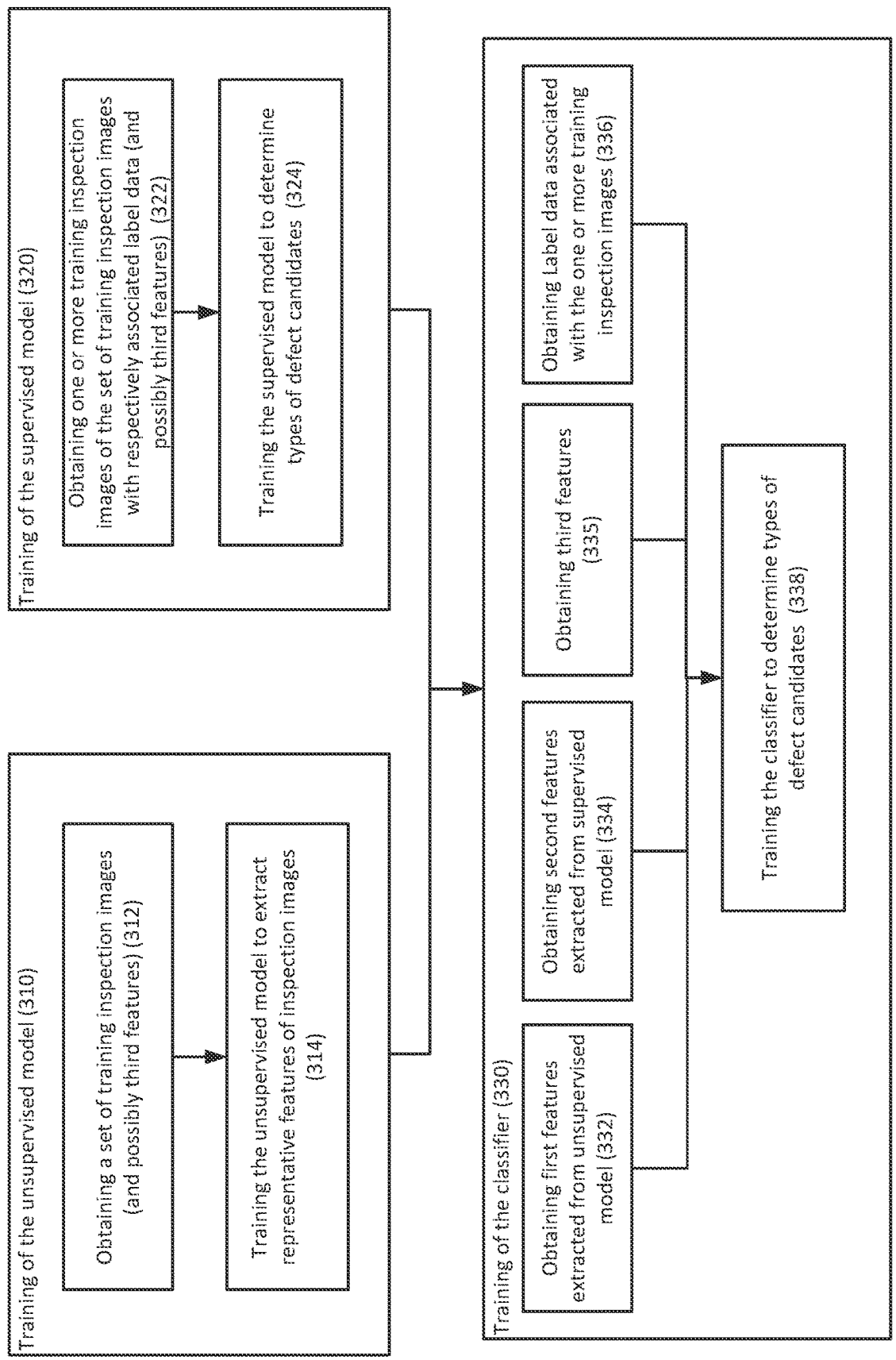
FIG. 3 illustrates a generalized flowchart of training the unsupervised model, the supervised model, and the classifier in accordance with certain embodiments of the presently disclosed subject matter.

Referring now to FIG. 3, there is illustrated a generalized flowchart of training the unsupervised model, the supervised model, and the classifier in accordance with certain embodiments of the presently disclosed subject matter.

According to certain embodiments, the supervised model and/or the unsupervised model can be previously trained with respective training data prior to being used as feature extractor for extracting and providing features for retraining the classifier. In 310, there is illustrated a training phase of the unsupervised model. A set of training inspection images, each representative of at least a portion of a specimen, can be obtained (312) as a first training set and the unsupervised model can be trained (314) using the first training set to extract representative features thereof. By way of example, the training inspection images in the first training set can include inspection image patches which are extracted corresponding to the defect candidates as indicated in the defect map of one or more specimens, as described above with reference to FIG. 4. The first training set is a dataset of images without labeled data. The unsupervised model can be trained by processing each image to generate an output reconstructed image, and optimize the parameters based on the output in relation to the input image. In some embodiments, the third features, as described above, can also be obtained and used together with the set of training inspection images to train the unsupervised model. In such cases, the first training set incudes the set of training inspection images and the third features.

As described above, the unsupervised model can be implemented, by way of example, as an autoencoder or any suitable variations/derivatives thereof. The unsupervised model can also be implemented as any model based on density estimation methods, such as any graphical or non-graphical models. For each input image in the training dataset, the autoencoder can extract features representative of the input image, and use the representative features to reconstruct a corresponding output image which can be evaluated by comparing with the input image. The autoencoder is trained and optimized so as to learn the representative features in the training images (e.g., the features can be representative of, e.g., structural elements, patterns, pixel distribution, etc., in the training images). A structural element refers to any original object on the image data that has a geometrical shape or geometrical structure with a contour. In some cases, a structural element can refer to a plurality of combined objects forming a pattern. A structural element can be presented, e.g., in the form of a polygon.

It is noted that in accordance with certain embodiments of the presently disclosed subject matter, the first training set used herein can include the entire FAB inspection data, such as, e.g., low resolution inspection images captured during the manufacturing process, or derivatives of the captured images obtained by various pre-processing stages, possibly associated with metadata and/or general attributes, etc. In some cases, the first training set can include inspection data related to all types of layers/products from all manufacturing phases. Alternatively, in some other cases, the first training set can include certain available inspection data selected in accordance with certain criteria (e.g. specific layer(s)/specific product(s), etc.).

In 320, there is illustrated a training phase of the supervised model. One or more training inspection images from the set of training inspection images which are associated with label data can be obtained (322). The one or more training inspection images and the associated label data form a second training set, and the supervised model can be trained (324) using the second training set to determine types of defect candidates. According to certain embodiments, the one or more training inspection images are selected from the entire set of training inspection images, i.e., the first training set, which are used to train the unsupervised model, in a similar manner as described above with reference to FIG. 4. By way of example, a list of defect candidates can be selected from the defect map as having higher probability of being DOI. The selected defect candidates are provided to a review tool and label data informative of types of the selected defect candidates can be generated by the review tool. The one or more training inspection images in the second training set are selected from the first training set as those corresponding to the selected defect candidates which are associated with label data. The supervised model can be trained by processing each training image in the second set to generate a predicted label, and optimizing the parameters based on the label data corresponding to the given image. In some embodiments, the third features as described above can also be obtained and used together with the one or more training inspection images associated with label data to train the supervised model. In such cases, the second training set includes the one or more training inspection images, the label data, and the third features.

According to certain embodiments, the supervised model and the unsupervised model can be trained and optimized separately. For instance, they can be trained in parallel, or sequentially one after the other.

Once the unsupervised model and supervised model are trained, such models can be put into inference stage in order to process the runtime inspection images and provide extracted features to retrain the classifier as described above with reference to FIG. 4. In 330, there is illustrated an exemplary training phase of the classifier. The training module can obtain (332) the first features extracted from one or more inspection images by the unsupervised model, and/or obtain (334) the second features extracted from one or more inspection images by the supervised model, and/or obtain (335) the third features. Label data associated with the one or more inspection images (e.g., the one or more inspection image patches 404) are also obtained (336) by the training module from the review tool. The training module uses the collected runtime data, i.e., extracted features and the label data, as training data to re-train (338) the classifier. The classifier can be constantly re-trained (e.g. responsive to new inspection data and label data obtained from the examination tools) in order to maintain its relevance to the constantly changing FAB data.

It is to be noted that in some cases, the unsupervised model and/or the supervised model can be also re-trained during runtime, based on the runtime data, prior to re-training of the classifier, as described above with reference to FIG. 4. In such cases, the training module 106 can be further configured to re-train the unsupervised model and/or the supervised model using the runtime data, in a similar manner as described above with reference to blocks 310 and 320.

Referring back to FIG. 2, once the classifier is retrained (208) using the inspection features and the label data, the re-trained classifier is also referred to as an updated classifier, or a second classifier (as relative to the classifier before being retrained, which is also referred to as a first classifier). The second classifier can be used to replace the first classifier as comprised in the examination recipe used by the inspection tool, thereby optimizing (210) (e.g., by the recipe update module 108) the examination recipe.

In some embodiments, the recipe update module 108 can be configured to determine whether to optimize the examination recipe based on one or more parameters, and only perform the optimization in response to a positive determination. The one or more parameters can comprise recipe update frequency, recipe performance history, customer policy, and situational analysis, etc. By way of example, one of the parameters can be a predetermined recipe update frequency. For instance, the recipe is updated for each wafer, i.e., every time after a wafer is inspected and reviewed and the inspection data and review data are used to retrain the classifier. In some cases, the recipe update frequency can be predetermined to update the recipe for every n (n>1) wafers. By way of another example, one of the parameters can be a customer policy, e.g., the customer can determine to update the recipe upon a predetermined condition being met. For instance, the customer may wish to stabilize the recipe and not to update it unless there are new types of defects reported by the review tool. If the label data received from the review tool indicates there are new types of defects, the classifier will be retrained and used to update the recipe.

By way of further example, one of the parameters can be recipe history or recipe performance history. Such a parameter can indicate if the recipe was previously updated, and if yes, the number of updates, and the corresponding performance of the respective updated recipes. For instance, if the recipe was not recently updated and the FAR of the last update did not meet a customer requirement, e.g., it was not compliant with the customer spec of acceptable FAR, it can be decided that the current recipe should be updated. By way of yet a further example, one of the parameters can be situational analysis based on the current FAB situation. For instance, in some cases FAB would like to stabilize the recipe thus does not allow further recipe update for a given time duration. In another example, if there is a performance deterioration, such as e.g., a yield drop in the FAB, it can be determined to update the recipe.

The optimized examination recipe is usable (212) (e.g., by the inspection tool 110) to examine a subsequent specimen.

The subsequent specimen can be in some cases the next specimen immediately following the current specimen, or a subsequent specimen within a distance of n specimens with respect to the current specimen (n>1).

Turning now to FIGS. 5A and 5B, there are illustrated two schematic diagrams of the recipe optimizer implementation with respect to the inspection tool and review tool in accordance with certain embodiments of the presently disclosed subject matter.

As described above, the recipe optimizer 101 can be implemented as a stand-alone computer to be used in conjunction with the inspection tool 110 and the review tool 112, or, alternatively, the functionality of the recipe optimizer 101, or at least part thereof, can be integrated with the inspection tool 110 or the review tool 112. In FIG. 5A, the recipe optimizer 101 is implemented as a separate unit operatively connected with the inspection tool and the review tool. Upon the inspection tool 110 and review tool 112 examining a current wafer n in runtime, the recipe optimizer 101 collects the inspection data and review data of wafer n respectively from the tools, and uses the collected data to retrain the classifier which is included in the current inspection recipe and used by the inspection tool 110 to examine wafer n. The retrained classifier can be sent by the recipe optimizer 101 to the inspection tool 110 to replace the current classifier in the recipe.

Since the retraining of the classifier is performed offline and may take time, the retrained classifier, when being sent to update the recipe in the inspection tool, can be used to examine the next wafer in line which may be wafer n+m, depending on the time to retrain the classifier relative to the time of wafer inspection and review. The inspection output to FAB in this scenario is the output of the classifier in the inspection tool (in addition, the review output from the review tool can also be provided to FAB). FAB can use such outputs for the purpose of process control. By way of example, wafer 1 is examined by a first classifier and the output of the first classifier will be provided as an examination result of wafer 1 to FAB. Once the first classifier is retrained offline using the data of wafer 1, the retrained classifier is used to replace the first classifier in the inspection tool. The next wafer in line, e.g., wafer 5, will be examined by the retrained classifier, and the output of the retrained classifier will be provided as an examination result of wafer 5 to FAB.

In some cases, the re-trained classifier can be evaluated before being decided to replace the current classifier. By way of example, the re-trained classifier can be used to generate an updated list of selected defect candidates based on the defect map of wafer n, and the updated list of selected defect candidates can be compared with the original list of selected defect candidates generated by the current classifier. A decision of whether to update the recipe by replacing the classifier can be made based on the comparison result.

In FIG. 5B, the recipe optimizer 101 is implemented in a similar way with respect to the inspection tool and the review tool, as described with reference to FIG. 5A. However, the functionality of the classifier module is taken out of the inspection tool, and kept only in the recipe optimizer module. Thus for a current wafer n, the defect map as generated by the detection module of the inspection tool can be sent from the inspection tool 110 to the recipe optimizer 101, and be processed by a current classifier comprised therein to generate a list of selected defect candidates. The list is provided as inspection output of wafer n to FAB. The classifier is retrained by the recipe optimizer 101 based on the runtime data of wafer n. The retrained classifier does not need to be sent to the inspection tool but rather kept in the recipe optimizer 101 for examining the next wafer n+1. The defect map of the next wafer n+1 can be sent from the inspection tool 110 to the recipe optimizer 101, and be processed by the retrained classifier therein to generate a list of selected defect candidates. The output of the retrained classifier will be provided as inspection output to FAB. In some cases, the review output from the review tool can be sent to FAB together with the inspection output.

Comparing the scenario of FIG. 5B to FIG. 5A, it is noted that the system as implemented in FIG. 5B has a relatively high frequency of recipe update (e.g., the classifier is retrained and updated after examining each wafer) while at the same time is relatively slow in generating an examination result for each wafer (e.g., wafer n+1 can only be examined once the classifier is retrained using data of wafer n), whereas the system as implemented in FIG. 5A has a relatively low frequency of recipe update (e.g., the classifier in the recipe of the inspection tool is updated for every m wafer) while it is relatively fast in generating an examination result for each wafer (e.g., each wafer between wafer n and wafer n+m can be examined using the current classifier until the classifier is retrained and updated in the recipe).

It is to be noted that the scenarios shown in FIGS. 5A and 5B are illustrated for exemplary purposes and should not be regarded as limiting the present disclosure in any way. The present disclosure can be implemented in either way of the above, or in any other possible implementation, in addition to, or in lieu of, the above.

According to certain embodiments, the recipe optimizer can receive inspection data from multiple inspection tools, and optimize the classifier, taking into consideration the tool-to-tool difference between the multiple inspection tools. As described above, retraining the classifier in runtime based on the up-to-date production data can enhance the classifier to be more robust to wafer/process variation, etc. In addition, when receiving inspection data from different tools, due to the tool-to-tool variance, optimizing the classifier to improve the performance of one tool may not be optimal for the performance of another tool. Therefore, care needs to be taken to select an optimal working point, taking into consideration the tool-to-tool difference, and retrain the classifier based on the selected working point.

Figure 6A:
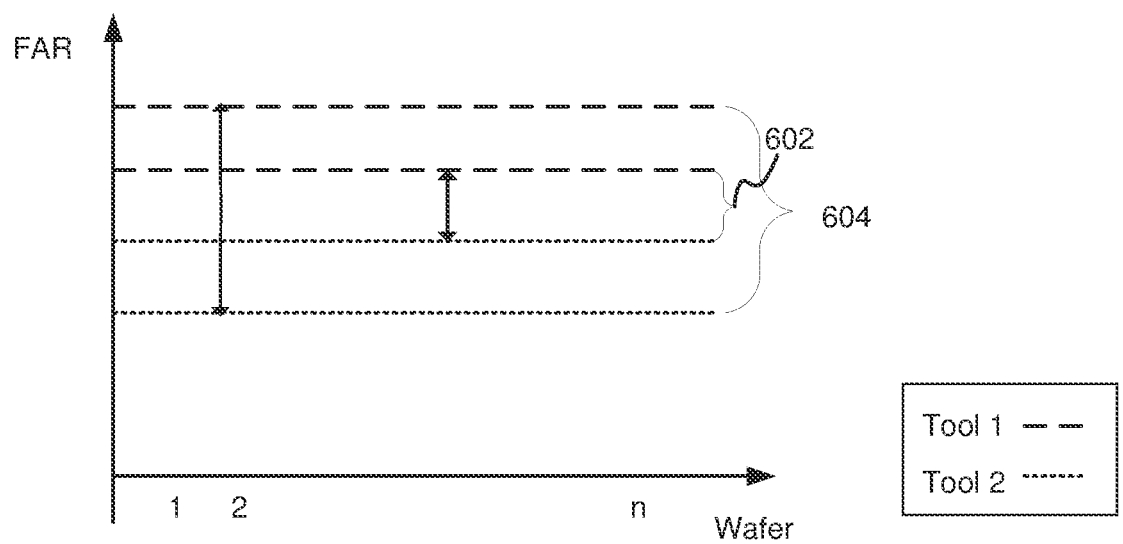
FIG. 6A illustrates a schematic graph illustrating tool-to-tool difference in accordance with certain embodiments of the presently disclosed subject matter.

Turning now to FIG. 6A, there is shown a schematic graph illustrating tool-to-tool difference in accordance with certain embodiments of the presently disclosed subject matter.

Assume the recipe optimizer receives inspection data from two inspection tools, e.g., tool 1 and tool 2. A classifier is retrained and optimized based on both tool data. FIG. 6A illustrates a coordinate axis where the X axis represents respective inspected wafers and Y axis represents corresponding false alarm rate (FAR) of the inspected wafers. There is exemplified the performance (in terms of FAR) of the two tools after two different optimization 602 and 604 of the classifier. In 602, the difference between the FAR of tool 1 and tool 2 is relatively small, whereas in 604, although the FAR of tool 2 is improved (i.e., reduced) as compared to 602, the FAR of tool 1 is however increased as compared to 602 thus causing a bigger gap between the FAR of tool 1 and tool 2 and affecting tool 1's performance, which is not desired by the customer. It is to be noted that although the FAR plots with respect to respective wafers are illustrated in the figure as straight lines, this is for purpose of simplicity of illustration only. It is understood by anyone skilled in the art that there may be variations in the FAR values of different wafers.

Figure 6B:
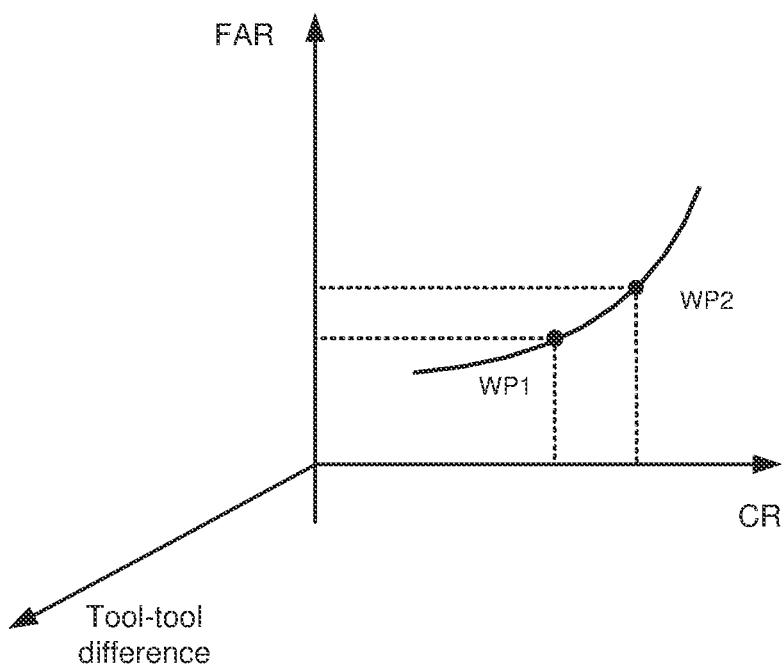
FIG. 6B is an illustration of selection of working points based on multiple parameters in accordance with certain embodiments of the presently disclosed subject matter.

Therefore, there is proposed to select an optimal working point in order to take into consideration the tool-to-tool difference when optimizing the classifier according to certain embodiments of the present disclosure. Turning now to FIG. 6B, there is an illustration of a selection of working points based on multiple parameters in accordance with certain embodiments of the presently disclosed subject matter.

The performance of a classifier can be measured by certain performance measures, such as FAR, DOI capture rate (CR), filter rate, accuracy, purity, rejection rate and the like. The performance measures can be predefined and can determine the selection of thresholds between types/classes. The selection of a desired classification performance and/or corresponding thresholds of classes for achieving the selected performance can be referred to herein as a working point for a classifier.

As shown in FIG. 6B, the x axis of the graph represents capture rate (CR), i.e., the percentage of captured DOI with respect to the entire known DOI population at a given threshold. The y axis of the graph represents FAR, which is defined as the percentage of nuisance or false alarms within the defects that are classified as DOI for a given threshold setting. The plot in FIG. 6B shows a set of working points corresponding to different system performances. As shown, at a working point WP2, more DOI can be captured (i.e., the DOI capture rate is relatively high), however, the FAR is also relatively high. At a different working point WP1, the FAR is lower than in WP2 while the capture rate also decreases. In other words, at WP1, less nuisance defects are classified as DOI, but this is at the cost of filtering out a large fraction of the DOI. Therefore, each working point provides a different trade-off between the two performance measures of capture rate and FAR in the present example. It is noted that different performance measures/parameters can be used to determine the working points in addition to or in lieu of the FAR and CR, as illustrated in FIG. 6B.

According to certain embodiments of the present disclosure, in order to take into consideration the tool-to-tool difference, it is proposed to add the tool-to-tool difference as an additional parameter when determining the working point (e.g., the additional parameter is added as an additional dimension in the graph of FIG. 6B in addition to the FAR and CR). In some cases, a working point can be selected in accordance with a predetermined condition so as to try to minimize the FAR and tool-to-tool difference while maximizing the capture rate. By way of example, the working point can be selected from a predetermined range defined by a lower range of the CR and an upper range of the FAR and the tool-to-tool difference. Although FIG. 6B illustrates only two exemplary working points, it is to be understood that the predetermined range of working points can be represented as a point cloud distributed in the parameter space as illustrated in FIG. 6B.

During training, the classifier is trained based on the training data in order to set the threshold(s) so as to achieve the desired performance defined by the working point. The threshold is usable for distinguishing between defects that are identified as belonging to a given class, and those that are not. The threshold is thus also referred to as a boundary or separation line/plane, depending on the dimensions of the attribute hyperspace of the defect candidates. A correlation between the working points and the values of thresholds can be obtained. Based on a desired working point (the values of the performance measures), a specific threshold (or a set of thresholds) for the classes can be determined. Thus, the trained classifier is capable to determine, subject to the thresholds, the class of a given defect candidate as a function of defect features/attributes associated with each predetermined defect class in a multi-dimensional attribute space (referred to herein as an attribute hyperspace). Specifically, the classifier receives in runtime, for each given defect candidate to be classified, a respective set of features thereof and applies the threshold(s) to classify the given defect candidate accordingly. Subject to required threshold(s), the classifier partitions the attribute hyperspace among predefined defect classes, and yields classified defects by assigning each defect candidate to one of the defect classes, depending on its location within the attribute hyperspace.

It is to be noted that although FIGS. 6A and 6B illustrate an example of tool-to-tool difference between two inspection tools, this should by no means be regarded as limiting the present disclosure. Multiple inspection tools, e.g., more than two inspection tools, can be applied to the present disclosed subject matter in a similar manner. By way of example, multiple parameters can be used, each indicative of a specific tool-to-tool difference between a pair of tools. By way of another example, a combined parameter indicative of a combined/averaged tool-to-tool difference among the multiple tools can be used when determining the working point. By way of a further example, a parameter indicative or the variance between the tool that has the worst performance to the tool that has the best performance, can be used.

According to certain embodiments of the presently disclosed subject matter, a specimen may comprise multiple layers fabricated through different process steps. For each layer, there is a specific examination recipe for inspecting the layer. The specific recipe can comprise a specific classifier trained based on the layer data. Therefore, for a product comprising layers 1 to n, there will be n classifiers trained corresponding to the respective layers. Each of the n classifiers can be re-trained and optimized using the above described optimization process. These classifiers can be referred to as layer-specific classifiers.

In some embodiments, a general-purpose classifier (GPC) can be generated and trained using all the training data collected from all layers. A GPC can be trained once using the collected training data, and the trained GPC can be used to perform classification for all layers in runtime. Since the GPC is trained based on a considerably large amount of training data pertaining to different layers, it can be assumed that the trained GPC has seen various types of defects and nuisances, and can be used directly for runtime classification without being further retrained. For example, when a new layer (of the current product or a different product) arrives, the GPC can be directly used for performing the classification on the new layer data, without having to train a new layer-specific classifier.

Figure 7A:
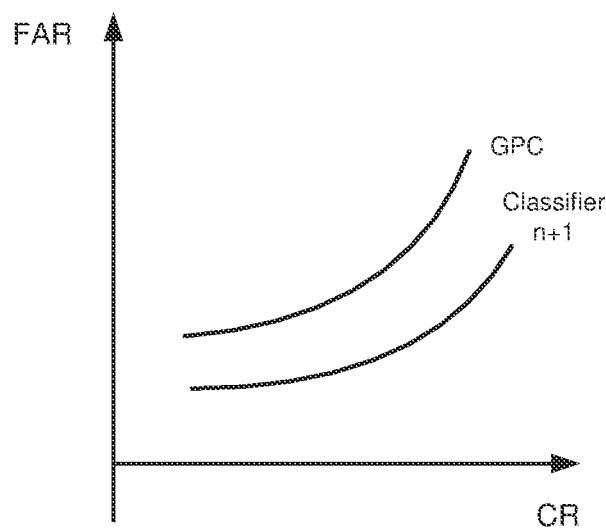
FIG. 7A illustrates a graph of performance comparison between the GPC and a layer-specific classifier for a given layer in accordance with certain embodiments of the presently disclosed subject matter.

For a given layer, the GPC, as a more generalized classifier, may have inferior performance as compared to a layer-specific classifier specifically trained for the given layer. FIG. 7A shows a graph of performance comparison between the GPC and a layer-specific classifier for a given layer in accordance with certain embodiments of the presently disclosed subject matter. As shown in the graph, x axis represents the capture rate (CR), and y axis represents the false alarm rate (FAR). For a new layer n+1, the layer-specific classifier (denoted as classifier n+1) has a better performance than the GPC, e.g., at a given FAR, the CR of the classifier n+1 is higher than the CR in the GPC, while at a given CR, the FAR of the classifier n+1 is lower than the FAR of the GPC.

Figure 7B:
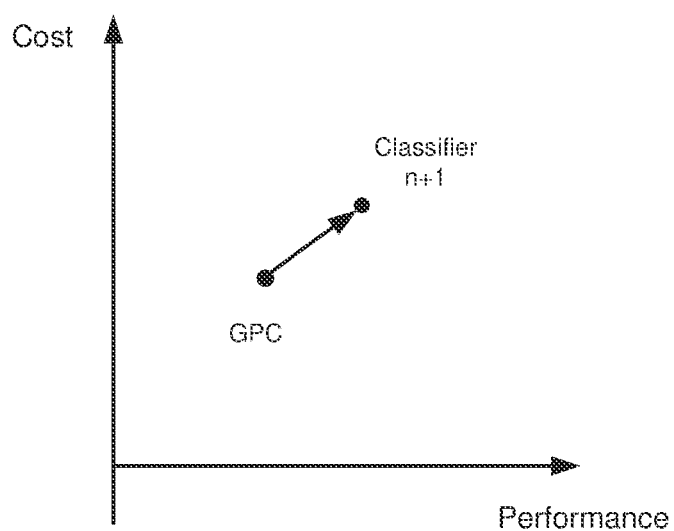
FIG. 7B illustrates a graph of cost and performance of a GPC with respect to a layer-specific classifier in accordance with certain embodiments of the presently disclosed subject matter.

However, as compared to the layer-specific classifier which is trained based on the layer training data and will be constantly retrained in runtime using new layer data, the GPC has the advantage of not incurring further training cost and is thus easy to use by customers. Continuing with the example in FIG. 7A, a layer-specific classifier such as the classifier n+1 will normally have a better performance compared to the GPC, while at the same time be more costly since it requires more resources from FAB and the tools for the retraining, as illustrated in FIG. 7B. In some cases, it is possible to start the process with a GPC and move to the classifier n+1 if needed. For instance, a GPC can be used to perform the classification for a new layer n+1, and, depending on the performance, it can be determined, if needed, to train a layer-specific classifier so as to improve the performance.

It is to be noted that the illustrated examples are described herein for illustrative purposes, and should not be regarded as limiting the present disclosure in any way. Other suitable examples can be used in addition to, or in lieu of, the above.

Among advantages of certain embodiments of the recipe optimization process as described herein is that the classifier as comprised in the examination recipe can be frequently and automatically retrained and updated based on the up-to-date production data, thereby enabling to optimize the examination recipe to be more robust to wafer/process variation, etc.

Among advantages of certain embodiments of the recipe optimization process as described herein is the ability to use various types of features to retrain the classifier, including inspection features extracted in various ways (e.g., through supervised and/or unsupervised learning models), optionally with additional features (such as, e.g., tool features and/or defect features and/or wafer features), so as to improve the performance (e.g., accuracy) of the trained classifier.

Among advantages of certain embodiments of the recipe optimization process as described herein is to use inspection features extracted from inspection images instead of using features extracted from review images, so as to be able to utilize the vast amount of inspection image data for training purposes. For instance, all available inspection images (or at least some thereof) can be used as training data for training the unsupervised and/or supervised model so that the trained models are capable of providing reliable representative features of runtime inspection images to the classifier for re-training purposes.

Among advantages of certain embodiments of the recipe optimization process as described herein is the ability to take into consideration the tool-to-tool difference between various inspection tools when training the classifier, e.g., by selecting a working point based on a plurality of performance parameters including a tool-to-tool difference parameter indicative of variance between multiple inspection tools and performing the retraining according to the working point. The classifier retrained in such a way is more robust to tool-to-tool variance.

The recipe optimization process as presently disclosed herein can be used for updating different modules (e.g., any learning based modules) in the examination recipe, in addition to or in lieu of the classifier module, such modules including, e.g., segmentation modules, noise reduction modules, pixel referencing modules, system performance and coactive correction modules, etc.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

What is claimed is:

1. A computerized system of automatic optimization of an examination recipe usable for semiconductor specimen examination, the system comprising a processing and memory circuitry (PMC) configured to:
   obtain, from a plurality of inspection tools, inspection data of a semiconductor specimen acquired during runtime examination, the inspection data comprising, for each inspection tool of the plurality of inspection tools, one or more inspection images representative of one or more defect candidates selected from a defect map of the semiconductor specimen using a classifier included in the examination recipe of the inspection tool;
   obtain, from a review tool, label data informative of types of the one or more defect candidates;
   select a working point based on a plurality of performance measure parameters comprising at least one tool-to-tool difference parameter indicative of variance among the plurality of inspection tools;
   retrain, in parallel to the runtime examination, the classifier based on the working point using training data comprising inspection features characterizing the one or more inspection images of each inspection tool and the label data thereof, giving rise to a retrained classifier; and
   replace the classifier with the retrained classifier to obtain an optimized examination recipe, the optimized examination recipe having improved robustness with respect to the variance among the plurality of inspection tools.

2. The computerized system according to claim 1, wherein the plurality of performance measure parameters further comprises, in addition to the at least one tool-to-tool difference parameter, at least one of: false alarm rate (FAR), capture rate (CR), filter rate, accuracy, purity, or rejection rate.

3. The computerized system according to claim 2, wherein the plurality of performance measure parameters further comprises, in addition to the at least one tool-to-tool difference parameter, the FAR and the CR, and wherein the PMC is configured to select the working point from a predetermined range defined to minimize the FAR and the tool-to-tool difference parameter while maximizing the CR.

4. The computerized system according to claim 1, wherein the PMC is further configured to retrain the classifier to set a threshold so as to achieve desired performance defined by the working point, the threshold being usable for distinguishing between defect candidates identified as belonging to a given class and defect candidates identified as not belong to the given class.

5. The computerized system according to claim 1, wherein the at least one tool-to-tool difference parameter is a combined parameter indicative of an averaged tool-to-tool variance among the plurality of inspection tools.

6. The computerized system according to claim 1, wherein the at least one tool-to-tool difference parameter is indicative of variance between an inspection tool that has a worst performance among the plurality of inspection tools and an inspection tool that has a best performance among the plurality of inspection tools.

7. The computerized system according to claim 1, wherein the at least one tool-to-tool difference parameter comprises a plurality of tool-to-tool difference parameters, each tool-to-tool difference parameter of the plurality of tool-to-tool difference parameters being indicative of a specific tool-to-tool variance between a pair of tools.

8. The computerized system according to claim 1, wherein the inspection features comprise a set of first features extracted by an unsupervised model previously trained using a set of training inspection images to extract representative features thereof.

9. The computerized system according to claim 8, wherein the inspection features further comprise a set of second features extracted by a supervised model, the supervised model being previously trained using one or more training inspection images of the set of training inspection images with respectively associated label data to determine types of defect candidates.

10. The computerized system according to claim 1, wherein the PMC is further configured to retrain the classifier using a set of features comprising at least one of: one or more tool features, one or more defect features and one or more specimen features, in addition to the inspection features.

11. The computerized system according to claim 1, wherein the PMC is further configured to determine whether to optimize the examination recipe based on at least one parameter of: a recipe update frequency, a recipe performance history, a customer policy, and a situational analysis, and wherein the replacing the classifier is performed in response to determining to optimize the examination recipe.

12. A computerized method of automatic optimization of an examination recipe usable for semiconductor specimen examination, the method performed by a processing and memory circuitry (PMC) and comprising:

obtaining, from a plurality of inspection tools, inspection data of a semiconductor specimen acquired during runtime examination, the inspection data comprising, for each inspection tool of the plurality of inspection tools, one or more inspection images representative of one or more defect candidates selected from a defect map of the semiconductor specimen using a classifier included in the examination recipe of the inspection tool;

obtaining, from a review tool, label data informative of types of the one or more defect candidates;

selecting a working point based on a plurality of performance measure parameters comprising at least one tool-to-tool difference parameter indicative of variance among the plurality of inspection tools;

retraining, in parallel to the runtime examination, the classifier based on the working point using training data comprising inspection features characterizing the one or more inspection images of each inspection tool and the label data thereof, giving rise to a retrained classifier; and replacing the classifier with the retrained classifier to obtain an optimized examination recipe, the optimized examination recipe having improved robustness with respect to the variance among the plurality of inspection tools.

13. The computerized method according to claim 12, wherein the plurality of performance measure parameters further comprises, in addition to the at least one tool-to-tool difference parameter, at least one of: false alarm rate (FAR), capture rate (CR), filter rate, accuracy, purity, or rejection rate.

14. The computerized method according to claim 13, wherein the plurality of performance measure parameters further comprises, in addition to the at least one tool-to-tool difference parameter, the FAR and the CR, and wherein the PMC is configured to select the working point from a predetermined range defined to minimize the FAR and the tool-to-tool difference parameter while maximizing the CR.

15. The computerized method according to claim 12, wherein the classifier is retrained to set a threshold so as to achieve desired performance defined by the working point, the threshold usable for distinguishing between defect candidates identified as belonging to a given class and those that are not.

16. The computerized method according to claim 12, wherein the at least one tool-to-tool difference parameter is a combined parameter indicative of an averaged tool-to-tool variance among the plurality of inspection tools.

17. The computerized method according to claim 12, wherein the at least one tool-to-tool difference parameter is indicative of variance between an inspection tool that has a worst performance among the plurality of inspection tools and an inspection tool that has a best performance among the plurality of inspection tools.

18. The computerized method according to claim 12, wherein the at least one tool-to-tool difference parameter comprises a plurality of tool-to-tool difference parameters, each tool-to-tool difference parameter of the plurality of tool-to-tool difference parameters being indicative of a specific tool-to-tool variance between a pair of tools.

19. The computerized method according to claim 12, wherein the inspection features comprise a set of first features extracted by an unsupervised model previously trained using a set of training inspection images to extract representative features thereof.

20. A non-transitory computer readable storage medium tangibly embodying a program of instructions that, when executed by a computer, cause the computer to perform a method of automatic optimization of an examination recipe usable for semiconductor specimen examination, the method comprising:

obtaining, from a plurality of inspection tools, inspection data of a semiconductor specimen acquired during runtime examination, the inspection data comprising, for each inspection tool of the plurality of inspection tools, one or more inspection images representative of one or more defect candidates selected from a defect map of the semiconductor specimen using a classifier included in the examination recipe of the inspection tool;

obtaining, from a review tool, label data informative of types of the one or more defect candidates;

selecting a working point based on a plurality of performance measure parameters comprising at least one tool-to-tool difference parameter indicative of variance among the plurality of inspection tools;

retraining, in parallel to the runtime examination, the classifier based on the working point using training data comprising inspection features characterizing the one or more inspection images of each inspection tool and the label data thereof, giving rise to a retrained classifier; and replacing the classifier with the retrained classifier to obtain an optimized examination recipe, the optimized examination recipe having improved robustness with respect to the variance among the plurality of inspection tools.

\* \* \* \* \*